(12) United States Patent
Sakurai

(10) Patent No.: US 6,287,750 B1
(45) Date of Patent: *Sep. 11, 2001

(54) METHOD OF MANUFACTURING SEMICONDUCTOR DEVICE IN WHICH OPENING CAN BE FORMED WITH HIGH PRECISION

(75) Inventor: Michio Sakurai, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/838,654

(22) Filed: Apr. 9, 1997

(30) Foreign Application Priority Data

May 17, 1996 (JP) .................................... 8-148360

(51) Int. Cl.$^7$ ........................................ G03F 7/40
(52) U.S. Cl. ..................... 430/313; 430/311; 430/330
(58) Field of Search .................................. 430/311, 313, 430/330

(56) References Cited

U.S. PATENT DOCUMENTS

| | | | |
|---|---|---|---|
| 4,229,248 | * | 10/1980 | Silverman ............................ 156/653 |
| 5,034,091 | * | 7/1991 | Trask ....................................... 216/18 |
| 5,219,787 | * | 6/1993 | Carey ................................... 437/187 |
| 5,316,978 | * | 5/1994 | Boyd ................................... 437/203 |
| 5,539,080 | * | 7/1996 | Hogan ................................. 528/353 |
| 5,667,922 | * | 9/1997 | Martiska ................................ 430/9 |

FOREIGN PATENT DOCUMENTS

| | | | |
|---|---|---|---|
| 263348 | * | 4/1988 | (EP) . |
| 2 263 981 | * | 8/1993 | (GB) . |
| 3-49244 | * | 3/1991 | (JP) . |
| 4179124 | | 6/1992 | (JP) . |
| 5190532 | | 7/1993 | (JP) . |
| 758107 | | 3/1995 | (JP) . |
| 7183296 | | 7/1995 | (JP) . |

* cited by examiner

Primary Examiner—Mark F. Huff
Assistant Examiner—Nicole Barreca
(74) Attorney, Agent, or Firm—Hayes, Soloway, Hennessey, Grossman & Hage, PC

(57) ABSTRACT

In a method of manufacturing a semiconductor device, an inorganic insulating layer is formed to cover a conductive layer, a polyimide layer is formed to cover the inorganic insulating layer, and a photo-resist layer is formed to cover the polyimide layer. An opening portion is formed by use of development or a wet etching to pass through the photo-resist layer and the polyimide layer to the inorganic insulating film. Then, after the photo-resist layer is removed, heat treatment is performed of the polyimide layer. Subsequently, the inorganic insulating film is etched using the polyimide layer having the opening portion as a mask. The photo-resist layer has a film thickness in a range of 4 to 10 $\mu$m, and the polyimide layer has a film thickness in a range of 5 to 20 $\mu$m.

3 Claims, 11 Drawing Sheets

METHOD OF MANUFACTURING SEMICONDUCTOR DEVICE IN WHICH OPENING CAN BE FORMED WITH HIGH PRECISION

BACKGROUND OF THE INVENTION

1. Field of the Invention

The present invention relates to a manufacturing method of a semiconductor device, and more particularly to a method of forming an opening for a conductive layer or a bonding pad in an interlayer insulating film or a passivation layer which has a lamination structure composed of an inorganic insulating layer as a moisture proofing layer and a polyimide layer as a buffer material layer.

2. Description of the Related Art

A first conventional example of a method of forming an opening for a bonding pad in a lamination structure of a polyimide layer and an inorganic insulating layer will be described with reference to FIGS. 1A to 1F. The lamination structure is used as a passivation layer. The method is disclosed in Japanese Laid Open Patent Disclosure (JP-A-Heisei 4-179124: reference 1).

First, referring to FIG. 1A, a bonding pad 102 is formed on a semiconductor substrate 101. Next, referring to FIG. 1B, a silicon nitride layer 103 as the inorganic insulating layer is formed by a plasma CVD method to cover the bonding pad 102 and the substrate 101. Next, referring to FIG. 1C, a photo-sensitive polyimide layer 104 is spin-coated on the silicon nitride layer 103. Subsequently, the substrate 101 is pre-baked in a nitrogen atmosphere to harden the photo-sensitive polyimide layer 104.

Next, referring to FIG. 1D, exposure is performed of the photo-sensitive polyimide layer 104 using a negative-type photo-mask 105. Subsequently, referring to FIG. 1E, development is performed using a dedicated developing solution. As a result, a part of the photo-sensitive polyimide layer 104 which has not been exposed in the process shown in FIG. 1D is developed and removed. In this manner, an opening 106 is formed in the photo-sensitive polyimide layer 104. Finally, referring to FIG. 1F, the silicon nitride layer 3 is dry-etched in a fluoric system atmosphere using the photo-sensitive polyimide layer 104 as an etching mask. Then, heat treatment is performed of the polyimide layer 104 in a nitrogen atmosphere. As a result, an opening 107 to the bonding pad 102 is formed in the passivation layer (103 and 104).

In this manner, in the first conventional example shown in FIGS. 1A to 1F, the opening 107 to the bonding pad 102 through the passivation layer (103 and 104) is formed with a single photo-lithography process.

However, in the first conventional method shown in FIGS. 1A to 1F, the buffer coat performance of the photosensitive polyimide layer 104 is inferior. For this reason, there is a problem in that decrease of reliability is caused. Also, there is another problem in that the manufacturing cost is increased because the photo-sensitive polyimide is higher in price than un-photosensitive polyimide.

Next, a second conventional example of a method of forming an opening to a bonding pad in a semiconductor device which uses a lamination structure composed of a polyimide layer and an inorganic insulating layer will be described with reference to FIGS. 2A to 2I. This second conventional method is disclosed in Japanese Laid Open Patent Disclosure (JP-A-Heisei 5-190532: reference 2). The lamination structure is used as a passivation layer.

First, referring to FIG. 2A, like the process shown in FIG. 1A, a bonding pad 202 is formed on a semiconductor substrate 201. Next, referring to FIG. 2B, a silicon nitride layer 203 as the inorganic insulating layer is formed on the bonding pad 202 and the substrate 201 by the plasma CVD method, as in the process shown in FIG. 1B. Subsequently, referring to FIG. 2C, a polyimide layer 204 is spin-coated on the silicon nitride layer 203 and then is pre-baked in a nitrogen atmosphere so that the polyimide layer 204 is hardened. Thereafter, referring to FIG. 2D, a negative-type photo-resist layer 205 is spin-coated on the polyimide layer 204.

Next, referring to FIG. 2E, exposure is performed of the photo-resist layer 205 using a positive-type photo-mask 206. Then, referring to FIG. 2F, development is performed of the photo-resist layer 205 using a dedicated developing solution. As a result, a part of the photo-resist layer 205 which has been exposed in FIG. 2E is developed and removed. In this manner, an opening 207 is formed through the photo-resist layer 205.

Next, referring to FIG. 2G, the polyimide layer 204 is selectively etched by organic solvent to form an opening 208, using the photo-resist layer 205 as an etching mask.

Next, referring to FIG. 2H, the silicon nitride layer 203 is dry-etched in a fluoric system atmosphere to form an opening 209 using the photoresist layer 205 and polyimide layer 204 as an etching mask.

Finally, referring to FIG. 2I, the photo-resist layer 205 is removed using a wet etching method. Subsequently, heat treatment is performed of the polyimide layer 204 in a nitrogen atmosphere. Thus, the opening 209 to the bonding pad 202 is formed in the passivation layer (203 and 204).

In this manner, in the second conventional method shown in FIGS. 2A to 2I, the opening 209 through the passivation layer (203 and 204) to the bonding pad 202 is also formed in a single photo-lithography process. Further, damage of the surface of the polyimide layer 204 due to the dry etching is restrained and a sticking error that trace of absorbed collets is left on the surface of the polyimide layer 204 is reduced in the mount.

However, in the second conventional method shown in FIGS. 2A to 2I, when the silicon nitride layer 203 is dry-etched, the surface of the photo-resist layer 205 is hardened. For this reason, there is a problem in that the photo-resist layer 205 cannot be removed by a wet etching method. Further, if an oxygen plasma ashing method is used to remove the hardened photo-resist layer 205, there is another problem in that the polyimide layer 204 is also removed. That is, this method is lacking in realizability.

A third conventional example of a manufacturing method of a semiconductor device in which a lamination structure composed of a polyimide layer and the inorganic insulating layer is used will be described with reference to FIGS. 3A to 3I. This conventional method is disclosed in Japanese Laid Open Patent Disclosure (JP-A-Heisei 5-190532: reference 2). The lamination structure is used as the interlayer insulating layer.

First, referring to FIG. 3A, an aluminum wiring layer 302 is formed on a semiconductor substrate 301. Subsequently, referring to FIG. 3B, a silicon nitride layer 303 as the inorganic insulating layer is formed by a plasma CVD method to cover the aluminium wiring layer 302 and the semiconductor substrate 301. Next, referring to FIG. 3C, a polyimide layer 304 is spin-coated, and then is pre-baked in a nitrogen atmosphere to be hardened in the film quality. Then, referring to FIG. 3D, a negative-type photo-resist layer 305 is spin-coated on the polyimide layer 304.

Next, referring to FIG. 3E, exposure is performed of the photo-resist layer 305 using a photo-mask 306. Then, referring to FIG. 3F, when development is performed using a dedicated developing solution, a part of the photo-resist layer 305 which has been exposed in the process shown in FIG. 3E is developed and removed. As a result, an opening 307 is formed by photo-resist layer 305.

Next, referring to FIG. 3G, the polyimide layer 304 is selectively etched in an oxygen system atmosphere such that an opening 308 is formed, using the photo-resist layer 305 as an etching mask. Subsequently, referring to FIG. 3H, dry etching is performed of the inorganic insulating layer 303 in a fluoric system atmosphere such that an opening 309 is formed, using the photo-resist layer 305 and the polyimide layer 304 as an etching mask.

Finally, referring to FIG. 3I, the photo-resist layer 305 is removed by a wet etching method. Subsequently, heat treatment is performed of the polyimide layer 304 in a nitrogen atmosphere. In this way, the through hole 309 is formed through the interlayer insulating layer (303 and 304) to the aluminum wiring layer 302.

In this manner, in the third conventional method shown in FIGS. 3A to 3I, the opening 309 through the interlayer insulating layer (303 and 304) to the aluminum wiring layer 302 is formed by the single photo-lithography process.

However, in the third conventional method shown in FIGS. 3A to 3I, when the silicon nitride layer 303 is dry-etched, there is a problem in that it is impossible to remove the photo-resist layer 305 by a wet etching method, because the surface of the photo-resist layer 305 is hardened.

Also, if the hardened photo-resist layer 305 is removed by an oxygen plasma ashing method, the polyimide layer 304 would be removed together with the photo-resist layer 305. Therefore, this method is lacking in realizability.

Further, the polyimide layer 304 which is used as the interlayer insulating layer has the film thickness of a few of 1000 Å. Thus, the polyimide layer 304 is very strong compared with the case where the polyimide layer 304 is used as the passivation layer. Accordingly, in order to form an opening in the polyimide layer 304 in an oxygen system atmosphere by an etching method with a small selection ratio, the thickness of photo-resist layer 305 must be made thicker. Thus, there is a problem in that the third conventional method is inferior in formation of a fine pattern.

SUMMARY OF THE INVENTION

The present invention is made in the light of the above-mentioned circumstances. Therefore, the object of the present invention is to provide a method of manufacturing a semiconductor device having a lamination structure of a polyimide layer and an inorganic insulating layer to have an opening through the lamination structure without increasing manufacturing cost and without hardening of a photo-resist layer.

In order to achieve an aspect of the present invention, a method of manufacturing a semiconductor device, includes the steps of:
   forming an inorganic insulating layer to cover a conductive layer;
   forming a polyimide layer to cover the inorganic insulating layer;
   forming a photo-resist layer to cover the polyimide layer;
   forming an opening portion by use of a development to pass through the photo-resist layer and the polyimide layer to the inorganic insulating film;
   removing the photo-resist layer after the formation of the opening portion;
   performing heat treatment of the polyimide layer after the formation of the opening portion;
   etching the inorganic insulating film using the polyimide layer having the opening portion as a mask.

In this case, the inorganic insulating layer is composed of a layer selected from the group consisting of an SiN layer, an SiON layer, a laminate layer of an SiN layer and an $SiO_2$ layer, and a laminate layer of an SiON layer and an $SiO_2$ layer. Also, it is desirable that the photo-resist layer has a film thickness in a range of 4 to 10 $\mu$m, and the polyimide layer has a film thickness in a range of 5 to 20 $\mu$m.

In order to achieve another aspect of the present invention, a method of manufacturing a semiconductor device, includes the steps of:
   forming an insulating coating layer on a conductive layer;
   forming on the insulating coating layer a buffer coating layer having a first opening portion, wherein the first opening portion is formed in a same process as formation of a mask for the first opening portion; and
   forming a second opening portion passing through the insulating coating layer to the conductive layer and connected to the first opening portion.

DESCRIPTION OF THE PREFERRED EMBODIMENTS

A manufacturing method of a semiconductor device of the present invention will be described below in detail with reference to the accompanying drawings.

FIGS. 4A to 4H are cross sectional views of the semiconductor device illustrating a manufacturing method of the semiconductor device according to an embodiment of the present invention.

Figure 1A:
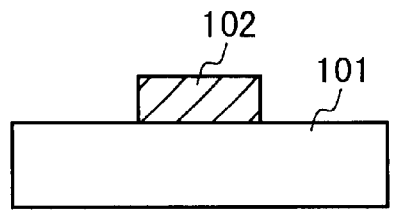
FIGS. 1A to 1F are cross sectional views of a semiconductor device illustrating the first conventional example of a manufacturing method of the semiconductor device.
Figure 1B:
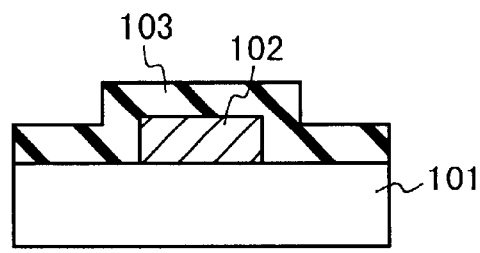
Figure 1C:
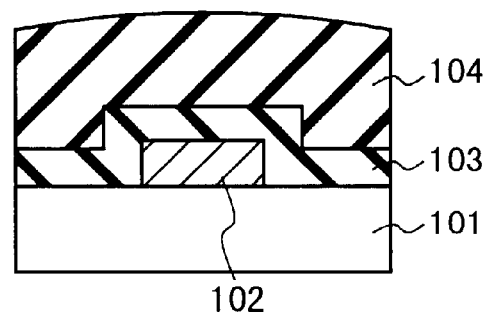
Figure 1D:
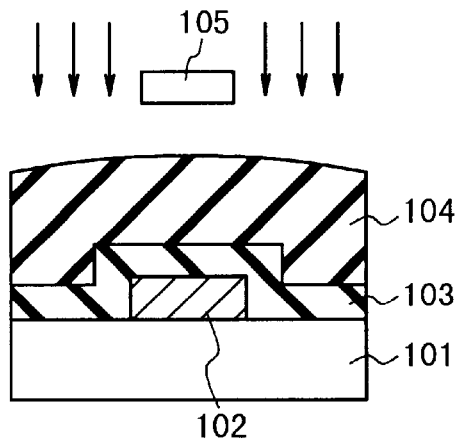
Figure 1E:
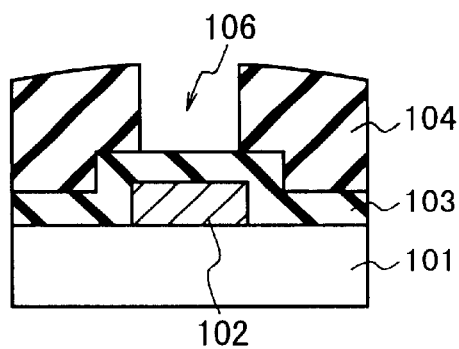
Figure 1F:
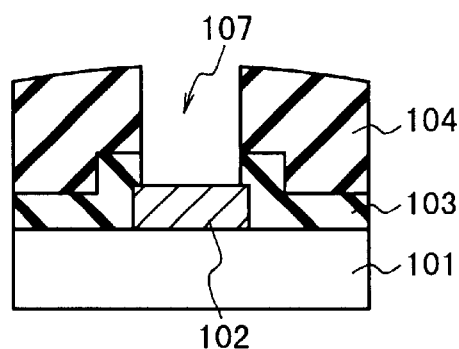
Figure 2A:
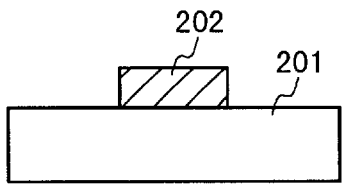
FIGS. 2A to 2I are cross sectional views of a semiconductor device Illustrating the second conventional example of a manufacturing method of the semiconductor device.
Figure 2B:
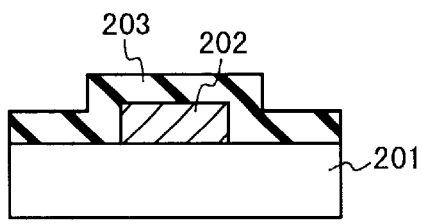
Figure 2C:
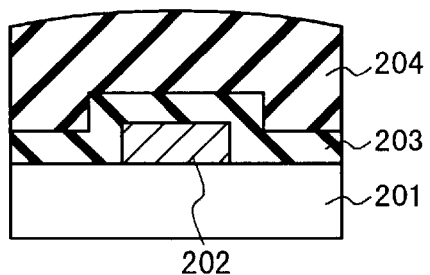
Figure 2D:
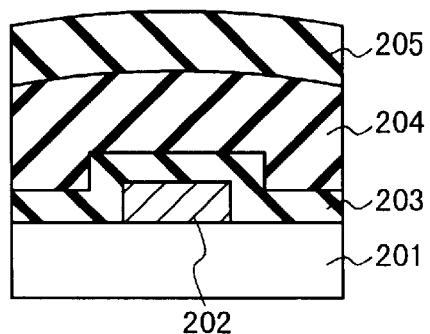
Figure 2E:
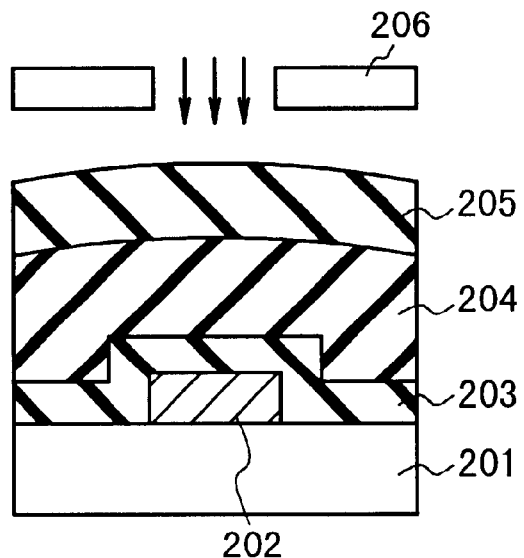
Figure 2F:
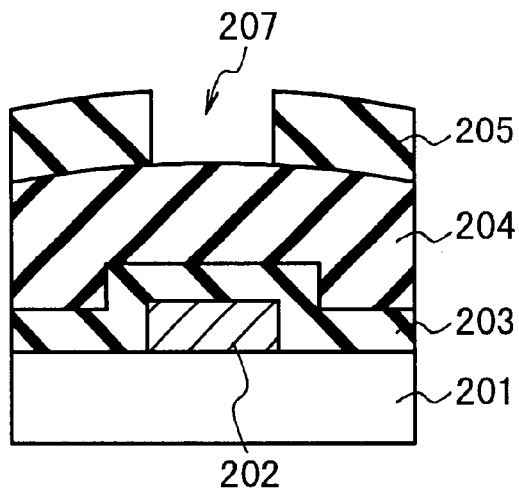
Figure 2G:
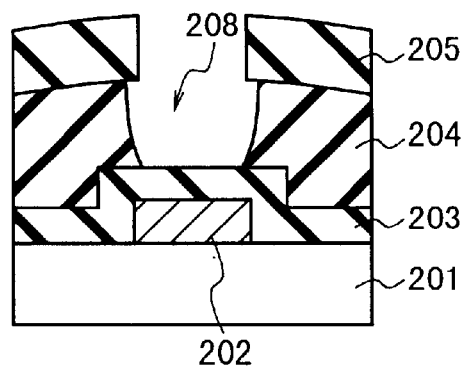
Figure 2H:
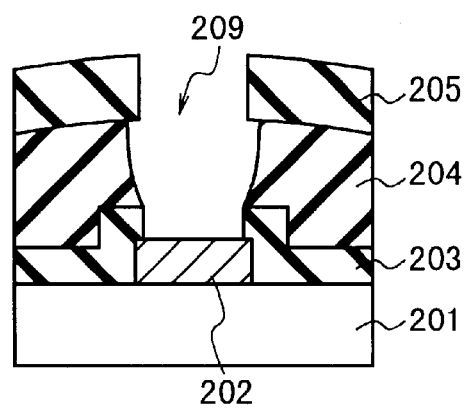
Figure 2I:
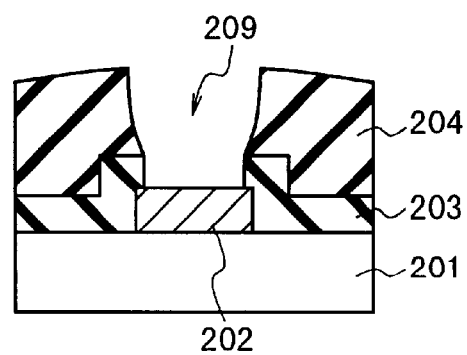
Figure 3A:
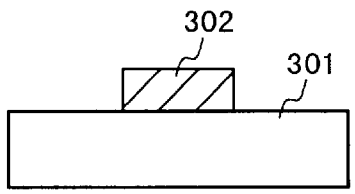
FIGS. 3A to 3I are cross sectional views of a semiconductor device illustrating the first conventional example of a manufacturing method of the semiconductor device.
Figure 3B:
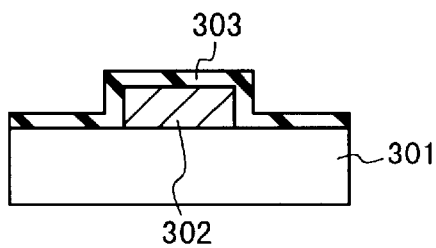
Figure 3C:
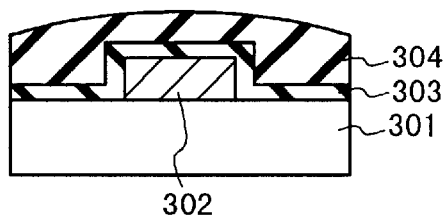
Figure 3D:
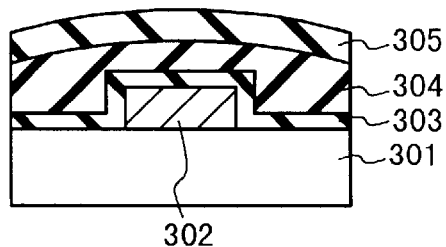
Figure 3E:
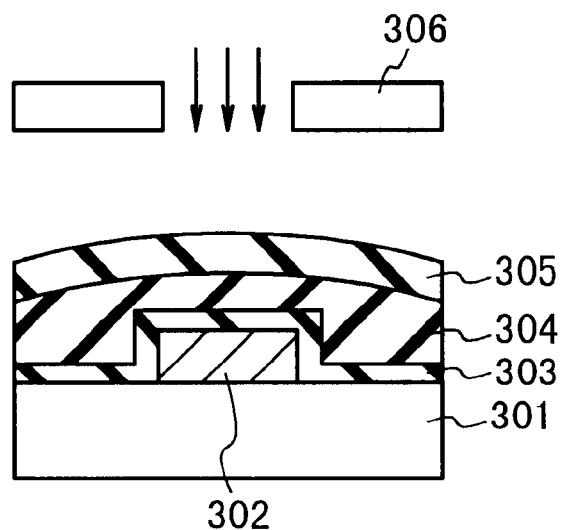
Figure 3F:
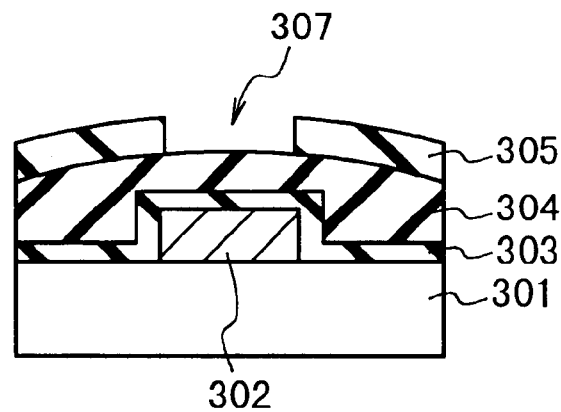
Figure 3G:
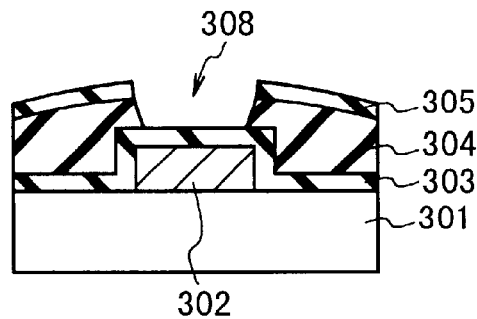
Figure 3H:
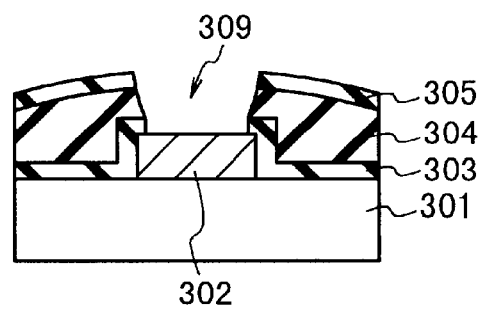
Figure 3I:
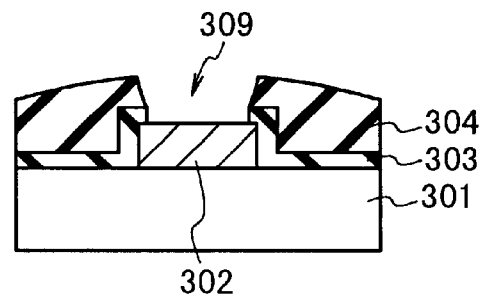
Figure 4A:
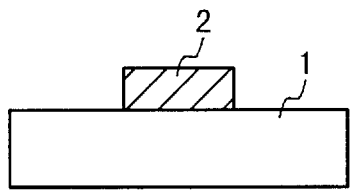
FIGS. 4A to 4H are cross sectional views of a semiconductor device illustrating a manufacturing method of the semiconductor device according to an embodiment of the present invention.
Figure 4B:
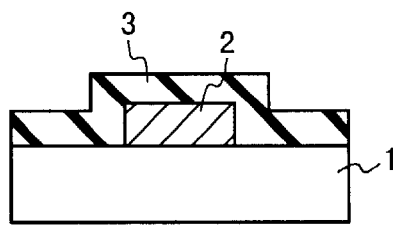
Figure 4C:
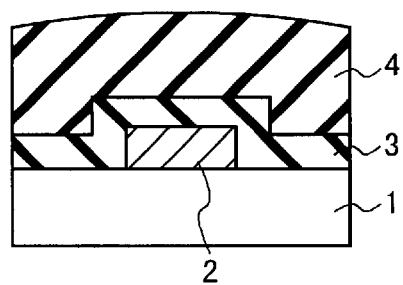
Figure 4D:
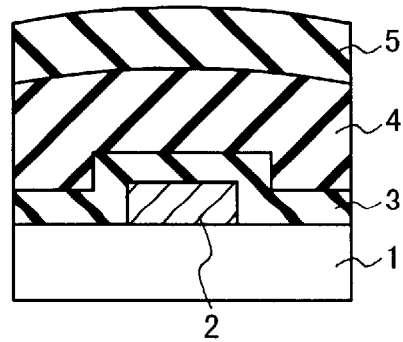

First, referring to FIG. 4A, a bonding pad 2 is formed on a semiconductor substrate 1. Then, referring to FIG. 4B, a silicon nitride layer 3 as an inorganic insulating layer is formed as a coating layer by a plasma CVD method to have the film thickness of about 0.3 $\mu$m. Subsequently, referring to FIG. 4C, a polyimide layer 4 is spin-coated to have the film thickness of about 10 $\mu$m. The polyimide layer 4 is pre-baked at the temperature of about 130° C. for about 2 minutes in a nitrogen atmosphere so that the polyimide layer 4 is hardened. Subsequently, referring to FIG. 4D, a positive-type photo-resist layer 5 is spin-coated to have the film thickness of about 4 $\mu$m. For example, OFPR800C commercially available from Tokyo Ohka Kogyo Co. Ltd. can be used as the positive-type photo-resist layer 5.

Figure 4E:
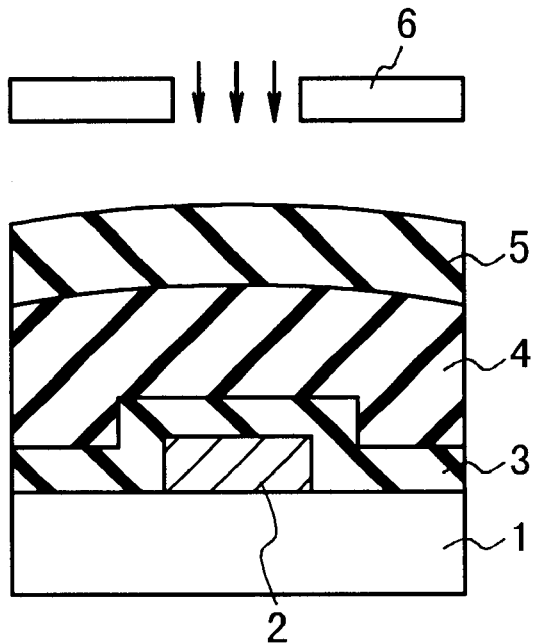

Next, referring to FIG. 4E, exposure is performed of the photo-resist layer 5 using a mask 6. Then, referring to FIG.

4F, when development is performed to the exposed photo-resist layer 5 for about 100 seconds using 2.38%TMAH as a developing solution. As a result, a part of the positive-type photo-resist layer 5 which has been exposed in the process shown in FIG. 4E is developed and removed. Also, the polyimide layer 4 is removed with the developing solution using the developed positive-type photo-resist layer 5 as a mask. Thus, an opening 7 is formed through the positive-type photo-resist layer 5 and the polyimide layer 4 to the inorganic insulating layer 3.

Figure 4F:
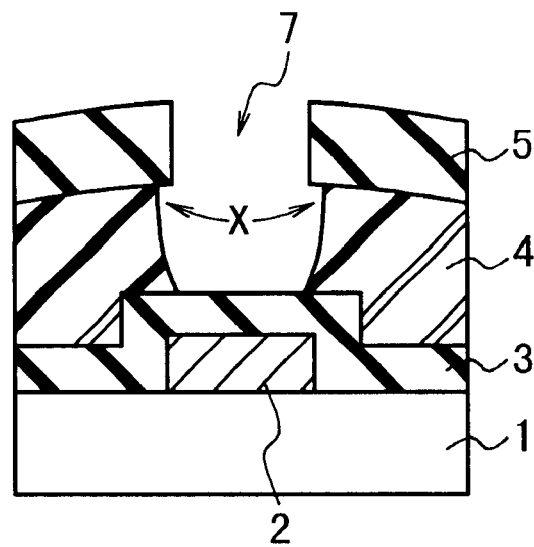

In this case, an undercut is caused in the polyimide layer 4 as shown by an arrow X in FIG. 4F. However, the thickness of the positive-type photo-resist layer 5 is made as thick as about 4 $\mu$m as mentioned above, so that mechanical strength of the positive-type photo-resist layer 5 is improved. Therefore, the positive-type photo-resist layer is never damaged during the development process. Also, the manufacture precision of the opening 7 can be remarkably improved.

Figure 4G:
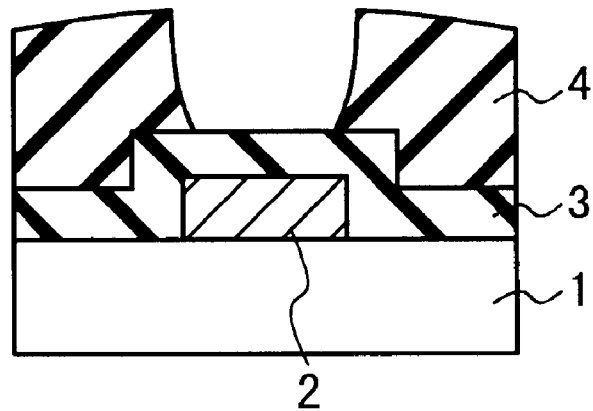

Next, referring to FIG. 4G, the positive-type photo-resist layer 5 is removed using a removing solution composed of butylacetate. Then, heat treatment is performed of the polyimide layer 4 at the temperature of about 350° C. for about 1 hour in a nitrogen atmosphere to form a buffer coating layer.

Figure 4H:
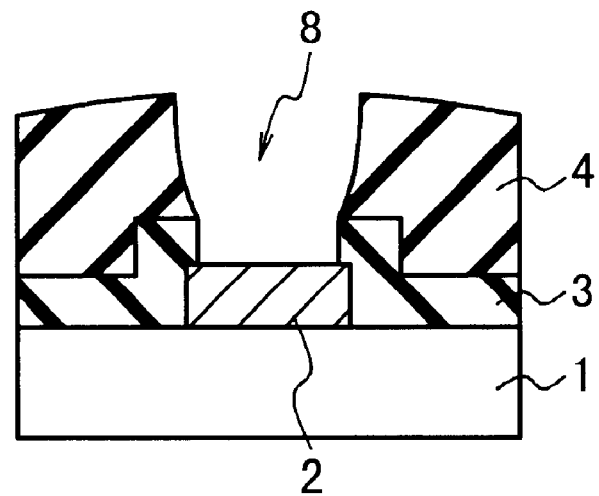

Finally, referring to FIG. 4H, the silicon nitride layer 3 as the inorganic insulating layer is dry-etched in a fluoric system ambience such that an opening 8 is formed, using the polyimide layer 4 as an etching mask. For example, the etching condition at this time is as follows:

$CF_4$ gas flow rate: 40 sccm, $O_2$ gas flow rate: 10 sccm, gas pressure: 50 Pa, power: 200 W, and etching time: 1 minute.

Thus, the opening 8 is formed through a passivation layer (3 and 4) to the bonding pad 2.

In this manner, in the above-mentioned embodiment, the opening through the passivation layer (3 and 4) to the bonding pad 2 is formed with a single photolithography process. In addition, in a case of the dry etching of the silicon nitride layer 4, because the positive-type photo-resist layer 5 is already removed, there is not a problem that the surface of the positive-type photo-resist layer 5 is hardened.

As the above-mentioned positive-type photo-resist layer 5, a non-ECA type photo-resist such as PF7550BMK commercially available from Sumitomo Chemical Co. Ltd. may be used for environment measure. In this case, the mechanical strength decreases a little, but there is no problem if the film thickness of the photo-resist is made as thick as about 5 $\mu$m.

Also, an SiON layer may be used instead of the silicon nitride layer 3. The above-mentioned etching condition in this case is as follows:

$CF_4$ gas flow rate: 50 sccm, $O_2$ gas flow rate: 40 sccm, gas pressure: 80 Pa, power: 600 W, and etching time: 1 minute.

Further, instead of the silicon nitride layer 3, a lamination structure of an SiN layer and an $SiO_2$ layer, or a lamination structure of an SiON layer and an $SiO_2$ layer. In this case, a dry etching process ($CF_4$ gas flow rate: 300 sccm, gas pressure: 12 Pa, power: 1200 W) for the $SiO_2$ layer is added.

Moreover, the present invention can be applied to the forming of an interlayer insulating layer in addition to the forming of a passivation layer.

As described above, according to the present invention, the photo-resist layer is not hardened, and the opening can be formed with high precision to pass through a passivation lamination structure of the polyimide layer and the inorganic insulating layer or the interlayer insulating layer.

What is claimed is:

1. A method of manufacturing a semiconductor device, comprising the steps in sequence of:

forming an inorganic insulating layer to cover a conductive layer;

forming a polyimide layer having a thickness in a range of 5 to 20 $\mu$m to cover said inorganic insulating layer;

forming a photo-resist layer having a thickness in a range of 4 to 10 $\mu$m to over said polyimide layer wherein said photo-resist layer has a sufficient film thickness such that said photo-resist layer is not destroyed when portions of said polyimide layer developed to form an opening portion;

exposing portions of said photo-resist layer using a mask;

developing, in a single step, exposed portions of said photo-resist layer and portions of said polyimide layer underlying said exposed portions of said photo-resist layer with a developer for a time sufficient to form an opening portion which passes through both said photo-resist layer and said polyimide layer to said inorganic insulating layer;

removing what remains of said photo-resist layer after the formation of said opening portion therein;

performing heat treatment of what remains of said polyimide layer after the formation of said opening portion therein; and etching said inorganic insulating layer using said polyimide layer having said opening portion as a mask to expose portions of said conductive layer.

2. A method according to claim 1, wherein said inorganic insulating layer is composed of a layer selected from the group consisting of an SiN layer, an SiON layer, a laminate layer of an SiN layer and an $SiO_2$ layer, and a laminate layer of an SiON layer and an $SiO_2$ layer.

3. A method according to claim 1, wherein the step of removing what remains of said photo-resist layer after the formation of said opening portion therein is performed by wet etching.

* * * * *

UNITED STATES PATENT AND TRADEMARK OFFICE
CERTIFICATE OF CORRECTION

PATENT NO.   : 6,287,750 B1                                        Page 1 of 1
DATED        : September 11, 2001
INVENTOR(S)  : Michio Sakurai It is certified that error appears in the above-identified patent and that said Letters Patent is hereby corrected as shown below:

Column 6,
Line 29, insert "are later" after -- layer --
Line 26, delete "over" and insert -- cover --

Signed and Sealed this

Seventeenth Day of September, 2002

Attest:

Attesting Officer

JAMES E. ROGAN
Director of the United States Patent and Trademark Office